(12) United States Patent
Kaur et al.

(10) Patent No.: US 11,521,703 B2
(45) Date of Patent: Dec. 6, 2022

(54) ROW REDUNDANCY TECHNIQUES

(71) Applicant: Arm Limited, Cambridge (GB)

(72) Inventors: Amandeep Kaur, Bangalore (IN); Andy Wangkun Chen, Austin, TX (US); Penaka Phani Goberu, Bangalore (IN); Khushal Gelda, Bangalore (IN)

(73) Assignee: Arm Limited, Cambridge (GB)

( * ) Notice: Subject to any disclaimer, the term of this patent is extended or adjusted under 35 U.S.C. 154(b) by 63 days.

(21) Appl. No.: 17/218,927

(22) Filed: Mar. 31, 2021

(65) Prior Publication Data

US 2022/0319632 A1 Oct. 6, 2022

(51) Int. Cl.
*G11C 29/00* (2006.01)
*G11C 29/44* (2006.01)
*G01R 31/3193* (2006.01)

(52) U.S. Cl.
CPC ........ *G11C 29/76* (2013.01); *G01R 31/31935* (2013.01); *G11C 29/4401* (2013.01)

(58) Field of Classification Search
CPC ..... G11C 29/76; G11C 29/4401; G11C 29/24; G11C 29/1202
See application file for complete search history.

(56) References Cited

U.S. PATENT DOCUMENTS

| | | | | |
|---|---|---|---|---|
| 5,617,364 A | * | 4/1997 | Hatakeyama | G11C 29/838 365/185.09 |
| 2010/0142275 A1 | * | 6/2010 | Yogev | G11C 29/76 711/E12.008 |

* cited by examiner

*Primary Examiner* — Han Yang
(74) *Attorney, Agent, or Firm* — Pramudji Law Group PLLC; Ari Pramudji

(57) ABSTRACT

Various implementations described herein are related to a method for identifying multi-bank memory architecture having multiple banks including a first bank and a second bank. The method may receive a faulty row address having a faulty bank selection bit, and also, the method may select the first bank or the second bank for row redundancy operations based on the faulty bank selection bit.

20 Claims, 11 Drawing Sheets

ROW REDUNDANCY TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some modern multi-bank memory designs, conventional row repair typically involves shifting every bank independently, which is inefficient for many applications that involve row redundancy. As such, there exists a need to improve physical circuit designs for row redundancy operations in various memory related applications.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are associated with row redundancy schemes and techniques for various memory related applications in physical circuit layout designs. Also, the various schemes and techniques described herein may provide robust row redundancy architecture so as to provide improved row-repair solutions that involves significant advantages for repairability of memory instance with optimal area. In various instances, multiple banks may share the same faulty row address (FRA) bits, and as such, repairability is reduced, and at the same time, the number of FRA pins may be reduced, e.g., by half. The various row redundancy schemes and techniques described herein may be used in memory architecture that may involve various types of memory, such as, e.g., static random access memory (SRAM). In addition, the memory architecture may include memory circuitry having an array of bitcells that are accessible via data access lines, such as, e.g., one or more wordlines and one or more bitlines.

Various implementations of row redundancy schemes and techniques for some memory applications will be described herein with reference to FIGS. 1A-6.

Figure 1A:
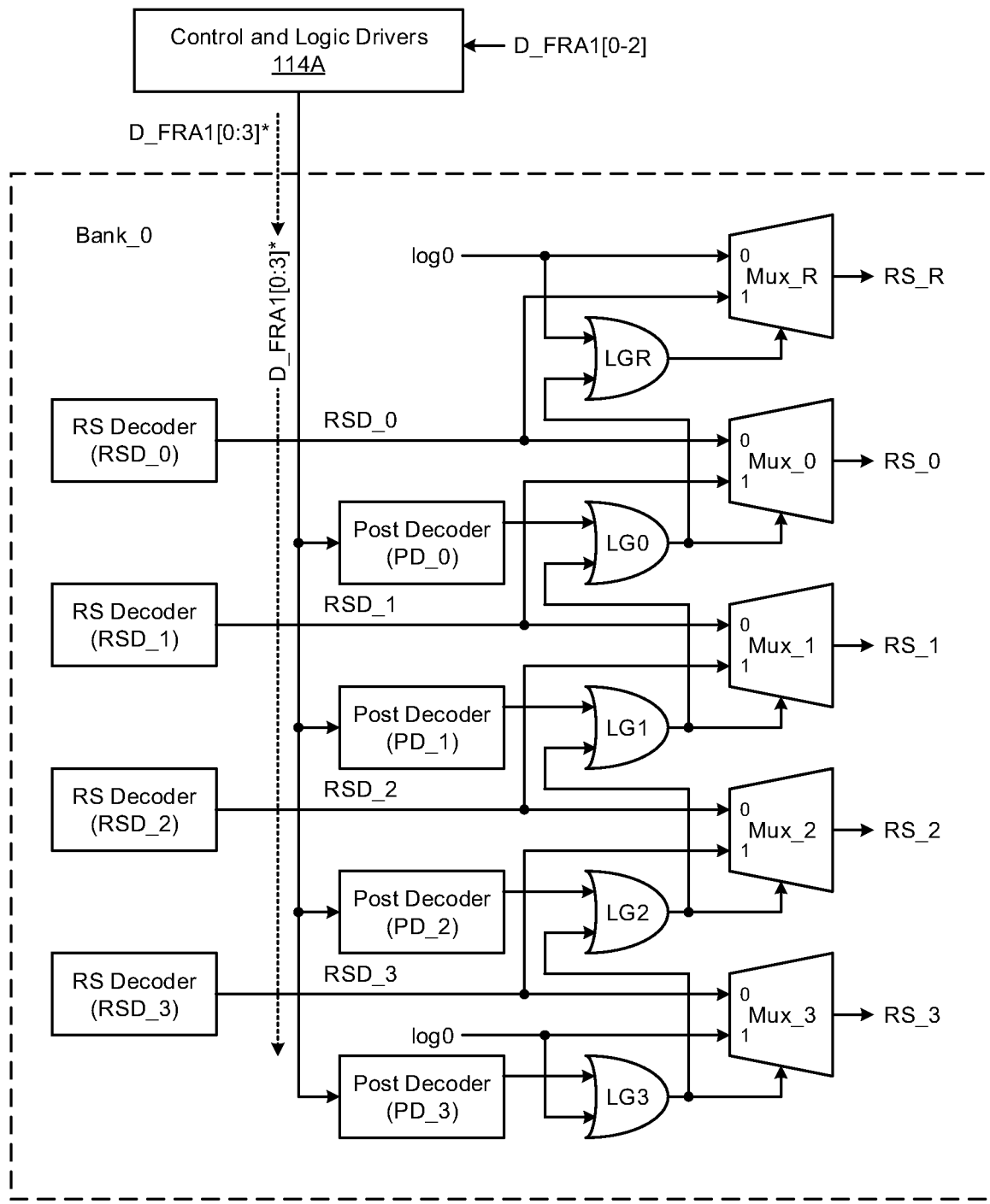
FIGS. 1A-1B illustrate diagrams of control and logic decoder architecture in accordance with various implementations described herein.
Figure 1B:
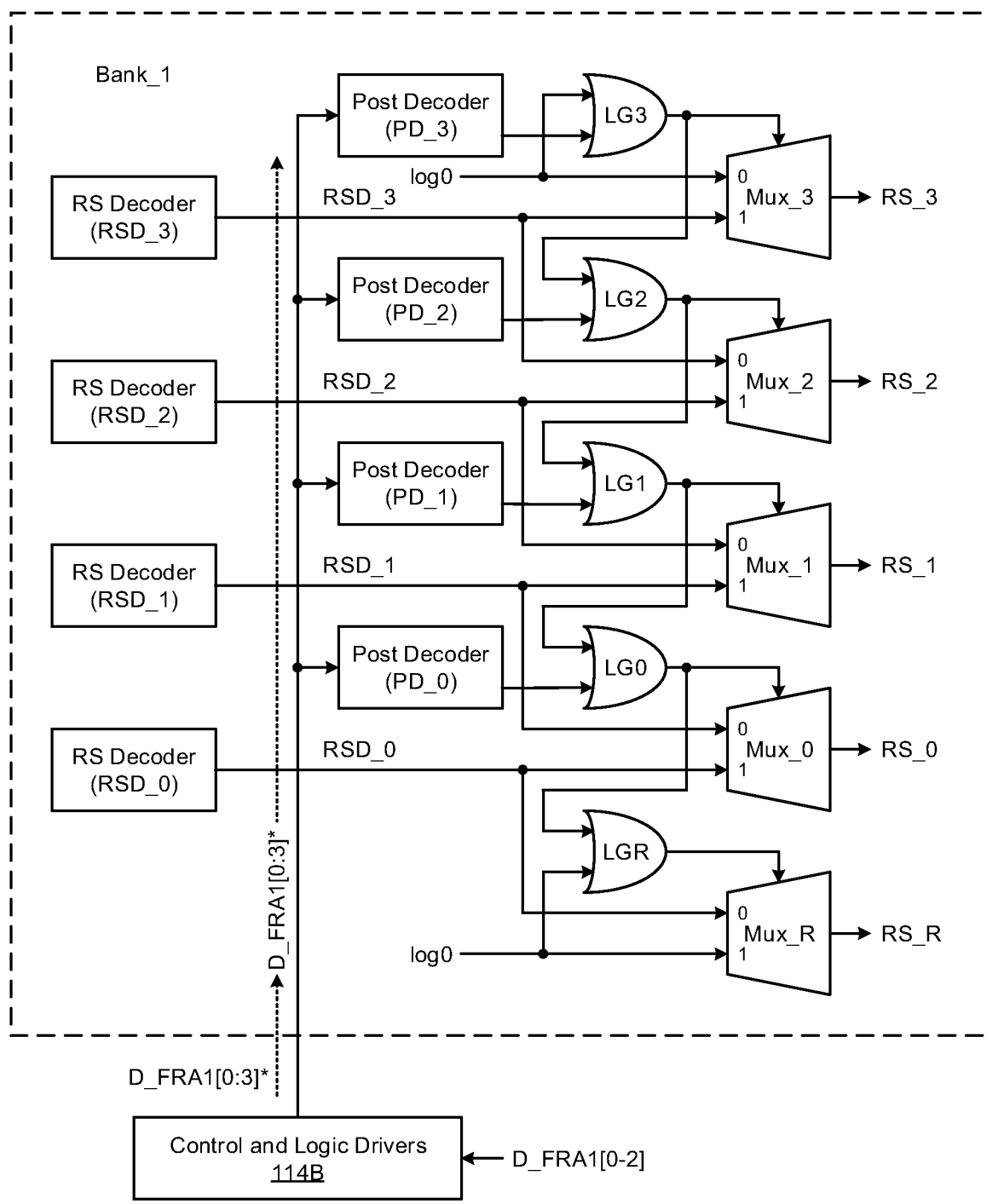

FIGS. 1A-11B illustrate diagrams of control and logic decoder architecture 104 in accordance with implementations described herein. In particular, in reference to flexible multi-bank memory architecture, FIG. 1A shows a diagram 100A of control and logic decoder architecture 104A for a first bank (Bank_0), and FIG. 1B shows a diagram 100B of control and logic decoder architecture 104B for a second bank (Bank_1). Also, in some instances, the banks (Bank_0, Bank_1) may be integrated together within a same memory device and also coupled to multiplexers (Mux) of each bank (Bank_0, Bank_1).

In some implementations, the control and logic decoder architecture 104, 104A, 104B may be implemented as a system or a device having various integrated circuit (IC) components that are arranged and coupled together as an assemblage or combination of parts that provide for physical circuit designs and related structures. In some instances, a method of designing, building, fabricating and/or manufacturing the control and logic decoder architecture 104, 104A, 104B as an integrated system or device may involve use of the various IC circuit components described herein so as to implement row redundancy schemes and techniques associated therewith. Moreover, the control and logic decoder architecture 104, 104A, 104B may be integrated with computing circuitry and other related components on a single chip, and also, the control and logic decoder architecture 104, 104A, 104B may be implemented in embedded systems related to automotive, electronic, mobile, server and Internet-of-things (IoT) applications.

As shown in FIG. 1A, the control and logic decoder architecture 104A for the first bank (Bank_0) may include various circuitry and components including, e.g., control and logic drivers 114A, row select decoders (RSD_0, RSD_1, RSD_2, RSD_3), and also multiplexers (Mux_0, Mux_1, Mux_2, Mux_3 and Mux_R). In some implementations, the control and logic drivers 114A are configured to receive and decode faulty row addresses (e.g., FRA1[0:3]) and provide decoded faulty row addresses (e.g., D_FRA1[0:3]). Also, the decoded faulty row addresses (e.g., D_FRA1[0:3]) may be applied to a mux selection input of each multiplexer (Mux_0, Mux_1, Mux_2, Mux_3 and Mux_R) and to the second bank (Bank_1) via the signal line that couples the control and logic decoders 104A, 104B together for the multiple banks (Bank_0, Bank_1).

In some implementations, each row select decoder (RSD_0, RSD_1, RSD_2, RSD_3) may be coupled to corresponding multiplexers (Mux_0, Mux_1, Mux_2, Mux_3 and Mux_R) that have one or more inputs and a single output. For instance, as shown in FIG. 1A, an output of a first row decoder (RSD_0) may be coupled to an input of a first multiplexer (Mux_0) and an input of a redundant multiplexer (Mux_R), and an output of a second row decoder (RSD_1) may be coupled to an input of a second multiplexer (Mux_1) and another input of the first multiplexer (Mux_0). The first multiplexer (Mux_0) provides a first RS signal (RS_0), and the second multiplexer (Mux_1) provides a second RS signal (RS_1). The other input of the redundant multiplexer (Mux_R) may be coupled to ground (log0) so as to receive a grounded log0 signal. Moreover, as shown in FIG. 1A, an output of a third row decoder (RSD_2) may be coupled to an input of a third multiplexer (Mux_2) and another input of the second multiplexer (Mux_1), and an output of a fourth row decoder (RSD_3) may be coupled to an input of a fourth multiplexer (Mux_3) and another input of the third multiplexer (Mux_2). The third multiplexer (Mux_2) may provide a third RS signal (RS_2), and the fourth multiplexer (Mux_3) may provide a fourth RS signal (RS_3). The other input of the fourth multiplexer (Mux_3) may be coupled to ground (log0) so as to receive a grounded log0 signal.

In some implementations, each multiplexer (Mux_0, Mux_1, Mux_2, Mux_3 and Mux_R) may be configured to receive one or more inputs and then provide a single output based on selected input from the decoded FRA signal (e.g., D_FRA1[0:3]*). For instance, the redundant multiplexer (Mux_R) may receive multiple input signals (RSD_0, log0) and provide a redundant row select signal (RS_R) as output based on a selection signal from logic (LGR), which receives inputs (log0, output from LG0). The first multiplexer (Mux_0) may receive multiple input signals (RSD_0, RSD_1) and provide a first row select signal (RS_0) as output based on a selection signal from logic (LG0), which receives inputs (output from post decoder (PD_0), output from LG1). The post decoder (PD_0) receives the D_FRA1[0:3]* signal and provides an output signal to logic (LG0). Also, the second multiplexer (Mux_1) may receive multiple input signals (RSD_1, RSD_2) and provide a second row select signal (RS_1) as output based on a selection signal from logic (LG1), which receives inputs (output from post decoder (PD_1), output from LG2). The post decoder (PD_1) receives the D_FRA1[0:3]* signal and provides an output signal to logic (LG1). Also, the third multiplexer (Mux_2) may receive multiple input signals (RSD_2, RSD_3) and provide a third row select signal (RS_2) as output based on a selection signal from logic (LG2), which receives inputs (output from post decoder (PD_2), output from LG3). The post decoder (PD_2) receives the D_FRA1[0:3]* signal and provides an output signal to logic (LG2). Also, the fourth multiplexer (Mux_3) may receive input signals (log0, RSD_3) and then provide a fourth row select signal (RS_3) as output based on a selection signal from logic (LG3), which receives inputs (log0, output from post decoder (PD_3)). The post decoder (PD_3) receives the D_FRA1[0:3]* signal and provides an output signal to logic (LG3). In various implementations, the RS signals (RS_0, RS_1, RS_2, RS_3 and RS_R) may be used for generating actual wordline (WL) signals.

As shown in FIG. 1B, the control and logic decoder architecture 104B for the second bank (Bank_1) may have similar circuitry and components as the control and logic decoder architecture 104A for the first bank (Bank_0) shown in FIG. 1A. For instance, the control and logic decoder architecture 104B in FIG. 1B may include, e.g., row select decoders (RSD_0, RSD_1, RSD_2, RSD_3) and multiplexers (Mux_0, Mux_1, Mux_2, Mux_3 and Mux_R). In some instances, the control and logic decoder architecture 104B for the second bank (Bank_1) may be configured to receive the decoded FRA signal (e.g., D_FRA1[0:3]*) from the control and logic drivers 104B. The decoded faulty row addresses (e.g., D_FRA1[0:3]*) may be applied to a mux selection input of each multiplexer (Mux_0, Mux_1, Mux_2, Mux_3 and Mux_R) via the signal line that is coupled to the control and logic decoder 104B in the second bank (Bank_1).

In some implementations, the control and logic decoder architecture 104, 104A, 104B for flexible multi-bank architecture is configured with a reduced number of faulty row address (FRA) pins for row redundancy operations that allow for area savings in physical layout design of the flexible multi-bank memory architecture. Also, the RS signals (RS_0, RS_1, RS_2, RS_3 and RS_R) may be used for generating actual wordline (WL) signals for row redundancy operations based on the reduced number of FRA pins.

Moreover, in various implementations, in reference to FIGS. 1A-1B, the row redundancy schemes and techniques described herein may be utilized in a device having memory architecture with one or more banks (Bank_0, Bank_1) along with logic circuitry 104, 104A, 104B that receives a faulty row address (FRA) having a faulty bank selection bit within the D_FRA1[0:3]* signal. In this instance, the control and logic architecture 104, 104A, 104B may be configured to use the faulty bank selection bit for identifying the faulty row address (FRA) as pertaining to a selected bank of the one or more banks (Bank_0, Bank_1). As described herein in reference to FIGS. 1A-1B above and also in FIGS. 2A-4B below, the control and logic architecture 104, 104A, 104B may be configured to utilize row redundancy operations for removing first rows from the selected bank, shifting memory operations involving the first rows to second rows, and/or also shifting memory operations involving the second rows to third rows associated with redundant rows that are defined in the selected bank. In some instances, the memory architecture may refer to multi-bank memory architecture with multiple banks, such as, e.g., first bank (Bank_0) and second bank (Bank_1), and also, the control and logic architecture 104, 104A, 104B may select the first bank (Bank_0) or the second bank (Bank_1) as the selected bank for the row redundancy operations based on the faulty bank selection bit.

In some instances, if the logic circuitry 104, 104A, 104B identifies the faulty row address (e.g., D_FRA1[0:3]*) as pertaining to the first bank (Bank_0), then the logic circuitry 104, 104A, 104B may perform one or more of the following row redundancy operations. For instance, the logic circuitry 104, 104A, 104B may remove first rows from the first bank (Bank_0), shift memory operations involving the first rows to second rows, and shift memory operations involving the second rows to third rows that are associated with redundant rows defined in the first bank (Bank_0).

In other instances, if the logic circuitry 104, 104A, 104B identifies the decoded faulty row address (e.g., D_FRA1[0:3]*) as pertaining to the second bank (Bank_1), then logic circuitry 104, 104A, 104B may perform one or more of the following row redundancy operations. For instance, the logic circuitry 104, 104A, 104B may remove first rows from the second bank (Bank_1), shift memory operations involving the first rows to second rows, and shift memory operations involving the second rows to third rows that are associated with redundant rows defined in the second bank (Bank_1).

Figure 1C:
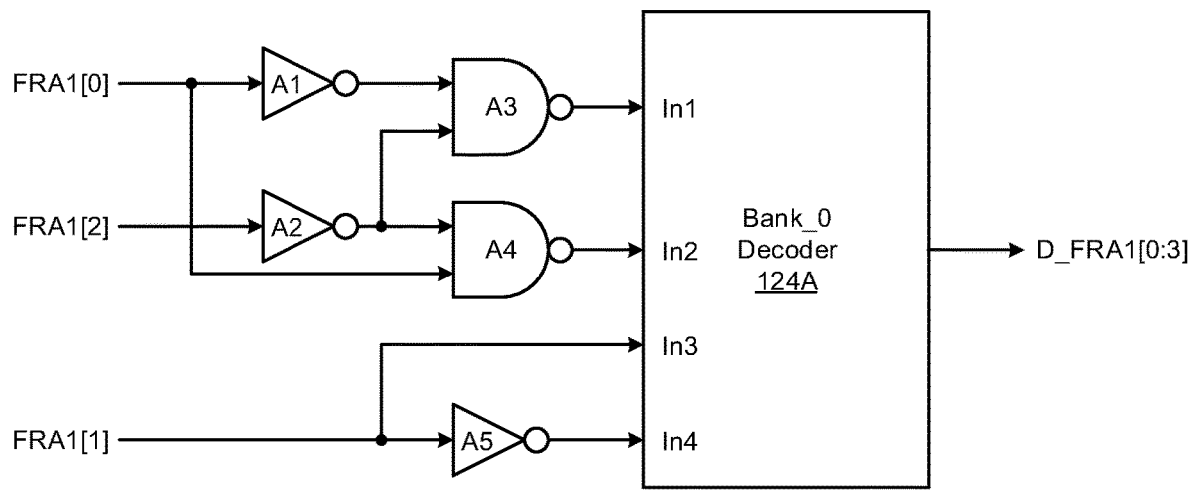
FIGS. 1C-1D illustrate diagrams of control and logic drivers in accordance with various implementations described herein.
Figure 1D:
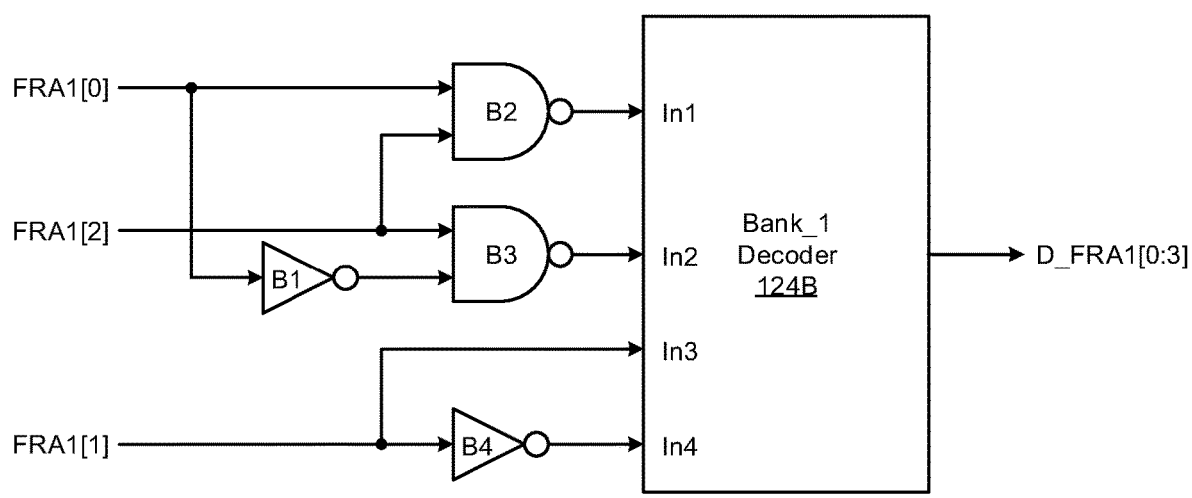

FIGS. 1C-1D illustrate various diagrams of the control and logic drivers 114A, 114B in accordance with various implementations described herein. In particular, FIG. 1C shows a diagram 100C of the control and logic drivers 114A associated with the control and logic decoder architecture 104A in FIG. 1A, and also, FIG. 1D shows a diagram 100D of the control and logic drivers 114B associated with the control and logic decoder architecture 104B in FIG. 1B.

As shown in FIG. 1C, the control and logic drivers 114A may include various logic devices (A1, A2, A3, A4, A5) along with a Bank_0 decoder 124A that are arranged and configured to receive faulty row address bits (e.g., FRA1[0], FRA1[1], FRA[2]) and provide decoded faulty row address (e.g., D_FRA1[0:3]). In some instances, logic device (A1) refers to an inverter that receives the FRA1[0] signal and provides an output signal (nFRA1[0]) to logic device (A3). Also, logic device (A2) refers to an inverter that receives the FRA1[2] signal and provides an output signal (nFRA1[2]) to logic devices (A3, A4). Also, logic device (A3) receives input signals (nFRA1[0], nFRA1[2]) and then provides an output signal to the Bank_0 decoder 124A as a first input signal (In1). Also, logic device (A4) may receive input signals (FRA1[0], nFRA1[2]) and then provides an output signal to the Bank_0 decoder 124A as a second input signal (In2). Also, the Bank_0 decoder 124A may receive the FRA1[1] signal as a third input signal (In3), and logic device (A5) may refer to an inverter that receives the FRA1[1] signal and then provides an output signal (nFRA1[1]) to the Bank_0 decoder 124A as a fourth input signal (In4). In some instances, logic devices (A3, A4) may refer to NAND gates; however, various other types of logic gates may be used to provide similar logical behavior and characteristics. Moreover, the Bank_0 decoder 124A receives the input signals (In1, In2, In3, In4) and then provides the decoded faulty row address (e.g., D_FRA1[0:3]) as an output signal.

As shown in FIG. 1D, the control and logic drivers 114B may include various logic devices (B1, B2, B3, B4) along with a Bank_1 decoder 124B that are arranged and configured to receive faulty row address bits (e.g., FRA1[0], FRA1[1], FRA[2]) and provide decoded faulty row address (e.g., D_FRA1[0:3]). In some instances, logic device (B1) refers to an inverter that receives the FRA1[0] signal and then provides an output signal (nFRA1[0]) to logic device (B3). Also, logic device (B2) receives input signals (FRA1 [0], FRA1[2]) and then provides an output signal to the Bank_1 decoder 124B as a first input signal (In1). Also, logic device (B3) receives input signals (nFRA1[0], FRA1 [2]) and then provides an output signal to the Bank_1 decoder 124B as a second input signal (In2). Also, the Bank_1 decoder 124B receives the FRA1[1] signal as a third input signal (In3), and logic device (B4) refers to an inverter that receives the FRA1[1] signal and provides an output signal (nFRA1[1]) to the Bank_1 decoder 124B as a fourth input signal (In4). In some instances, logic devices (B2, B3) may refer to NAND gates; however, various other types of logic gates may be used to provide similar logical behavior and characteristics. Moreover, Bank_1 decoder 124B receives the input signals (In1, In2, In3, In4) and then provides the decoded faulty row address (e.g., D_FRA1[0: 3]) as an output signal.

Figure 2A:
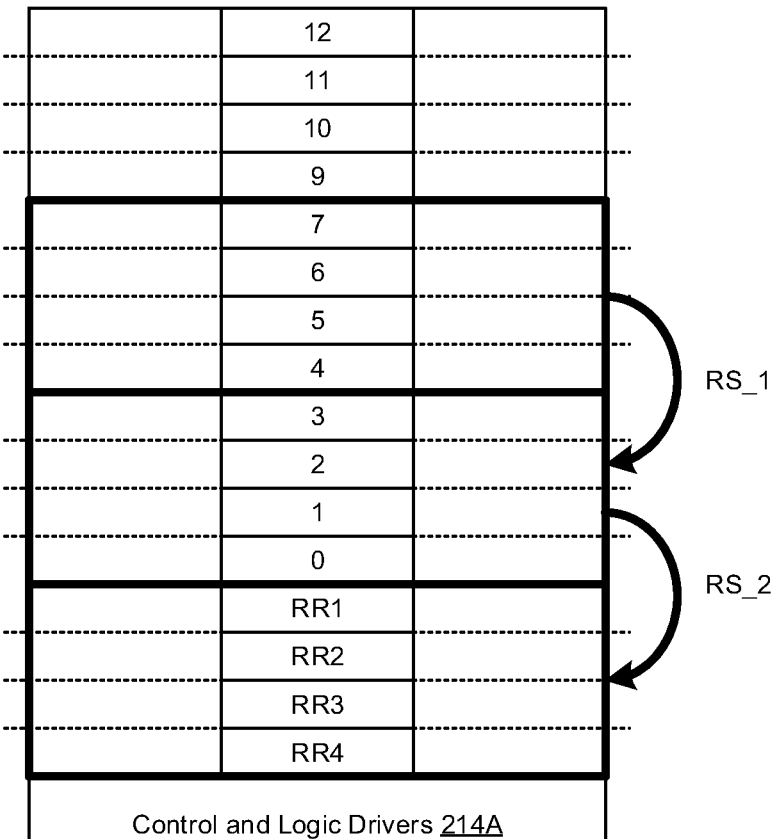
FIG. 2A illustrates a diagram of single-bank architecture in accordance with various implementations described herein.

FIG. 2A illustrates a diagram 200A of single-bank memory architecture 204A in accordance with various implementations described herein.

In various implementations, the single-bank memory architecture 204A may be implemented as a system or device having various integrated circuit (IC) components that are arranged and coupled together as an assemblage or combination of parts that provide for physical circuit designs and various related structures. In various instances, a method of designing, building, fabricating and manufacturing the single-bank memory architecture 204A as an integrated system or device may involve use of the various IC circuitry and/or components described herein so as to implement various row redundancy schemes and techniques associated therewith. Further, the single-bank memory architecture 204A may be integrated with computing circuitry and related components on a single chip, and also, the single-bank memory architecture 204A may be implemented in embedded systems for various automotive, electronic, mobile, server and IoT applications.

As shown in FIG. 2A, the single-bank memory architecture 204A may include control and logic driver circuitry 214A and sets of rows (0-3, 4-7, 9-12) along with a set of redundant rows (RR1-RR4). In some implementations, row redundancy operations may be enabled for at least one row, such as, e.g., RRE=1, with at least one faulty row address pin, such as, e.g., FRA[1:0]=01. In reference to a first row shift (RS_1), a first set of rows (4-7) may be shifted to a second set of rows (0-3), wherein row 7 is shifted to row 3, row 6 is shifted to row 2, row 5 is shifted to row 1, and row 4 is shifted to row 0. In reference to a second row shift (RS_2), a second set of rows (0-3) may be shifted to a third set of rows (redundant rows: RR1-RR4), wherein row 3 is shifted to row RR1, row 2 is shifted to row RR2, row 1 is shifted to row RR3, and row 0 is shifted to row RR4.

In some implementations, the sets of rows (0-3, 4-7, 9-12) along with a set of redundant rows (RR1-RR4) may refer to rows of memory cells or bitcells that are arranged in various applicable configurations, such as, e.g., a two-dimensional (2D) memory array having a number (N) of columns (Ncolumns) and a number (N) of rows (Nrows) with the bitcells arranged in a 2D grid pattern with indexing capabilities. Also, each bitcell may be configured to store a data bit (e.g., a data value related to a logical '0' or '1'). In various memory applications, the single-bank memory architecture 204A may be implemented as an integrated circuit (IC) in using various types of memory, such as, e.g., random access memory (RAM), including static RAM (SRAM) or any other type of similar memory. Also, the single-bank memory architecture 204A may be integrated with computing circuitry and other related components on a single chip, and the single-bank memory architecture 204A may be implemented in embedded systems for electronic, mobile and IoT applications.

Figure 2B:
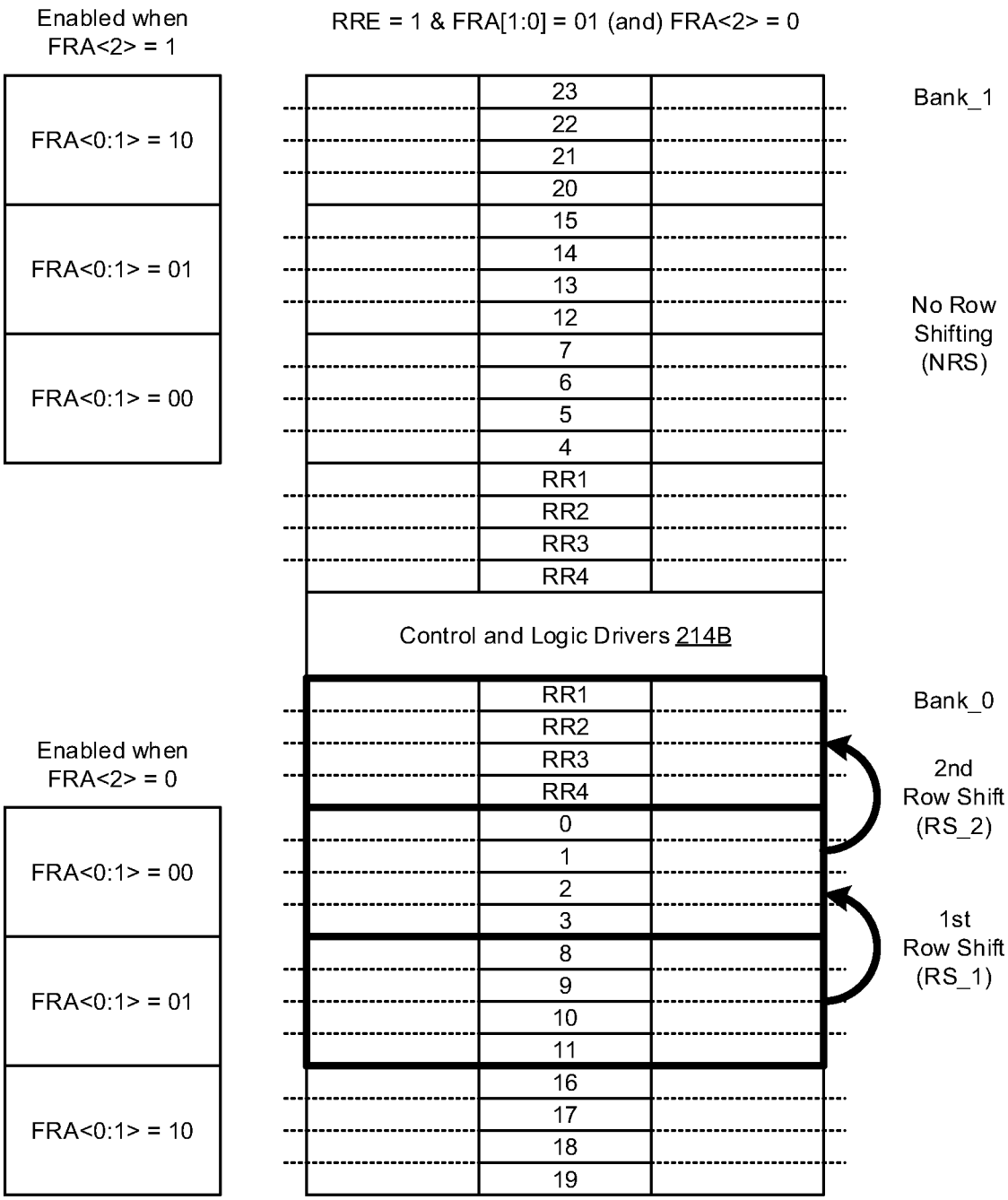
FIG. 2B illustrates a diagram of flexible multi-bank architecture in accordance with various implementations described herein.

FIG. 2B illustrates a diagram 200B of flexible multi-bank architecture 204B in accordance with various implementations described herein. In various implementations, the multi-bank architecture 204B may include multiple banks (e.g., Bank_0, Bank_1), such that each bank (Bank_0, Bank_1) has similar features, characteristics and behaviors as the single-bank architecture 204A shown in FIG. 1A.

In various implementations, the multi-bank memory architecture 204B may be implemented as a system or device having various integrated circuit (IC) components that are arranged and coupled together as an assemblage or combination of parts that provide for physical circuit designs and various related structures. In various instances, a method of designing, building, fabricating and manufacturing the multi-bank memory architecture 204B as an integrated system or device may involve use of the various IC circuitry and/or components described herein so as to implement various row redundancy schemes and techniques associated therewith. Further, the multi-bank memory architecture 204B may be integrated with computing circuitry and related components on a single chip, and also, the multi-bank memory architecture 204B may be implemented in embedded systems for various automotive, electronic, mobile, server and IoT applications.

As shown in FIG. 2B, the multi-bank memory architecture 204B may include control and logic driver circuitry 214B that is coupled between the first bank (Bank_0) and the second bank (Bank_1). In some implementations, the first bank (Bank_0) may include multiple sets of rows (0-3, 8-11, 16-19) along with a set of redundant rows (RR1-RR4), and also, the second bank (Bank_1) may include multiple sets of rows (4-7, 12-15, 20-23) along with another set of redundant rows (RR1-RR4).

In various implementations, row redundancy operations may be enabled for the first bank (Bank_0) with FRA<2>.=0 or the second bank (Bank_1) when FRA<2>=1. For instance, with RRE=1 and FRA[1:0]=01 such that FRA<2>=0, then the first bank (Bank_0) is selected for row redundancy operations. In this instance, in reference to a first row shift (RS_1), a first set of rows (8-11) may be shifted to a second set of rows (0-3), and also, in reference to a second row shift (RS_2), a second set of rows (0-3) may be shifted to a third set of rows (redundant rows: RR1-RR4). As such, the memory row locations in the first bank (Bank_0) are re-assigned or re-mapped such that the rows 8-11 are re-mapped to rows 0-3, and rows 0-3 are re-mapped to rows RR1-RR4. Also, the remaining unshifted rows (16-19) in the first bank (Bank_0) remain accessible with unmodified memory access operations. Moreover, the rows (4-7, 12-15, 20-23) along with the redundant rows (RR1-RR4) in the second bank (Bank_1) remain unshifted and are accessible with unmodified memory access operations. Thus, no row redundancy is performed on the second bank (Bank_1), and as such, the second bank (Bank_1) has no row shifting (NRS).

Figure 3A:
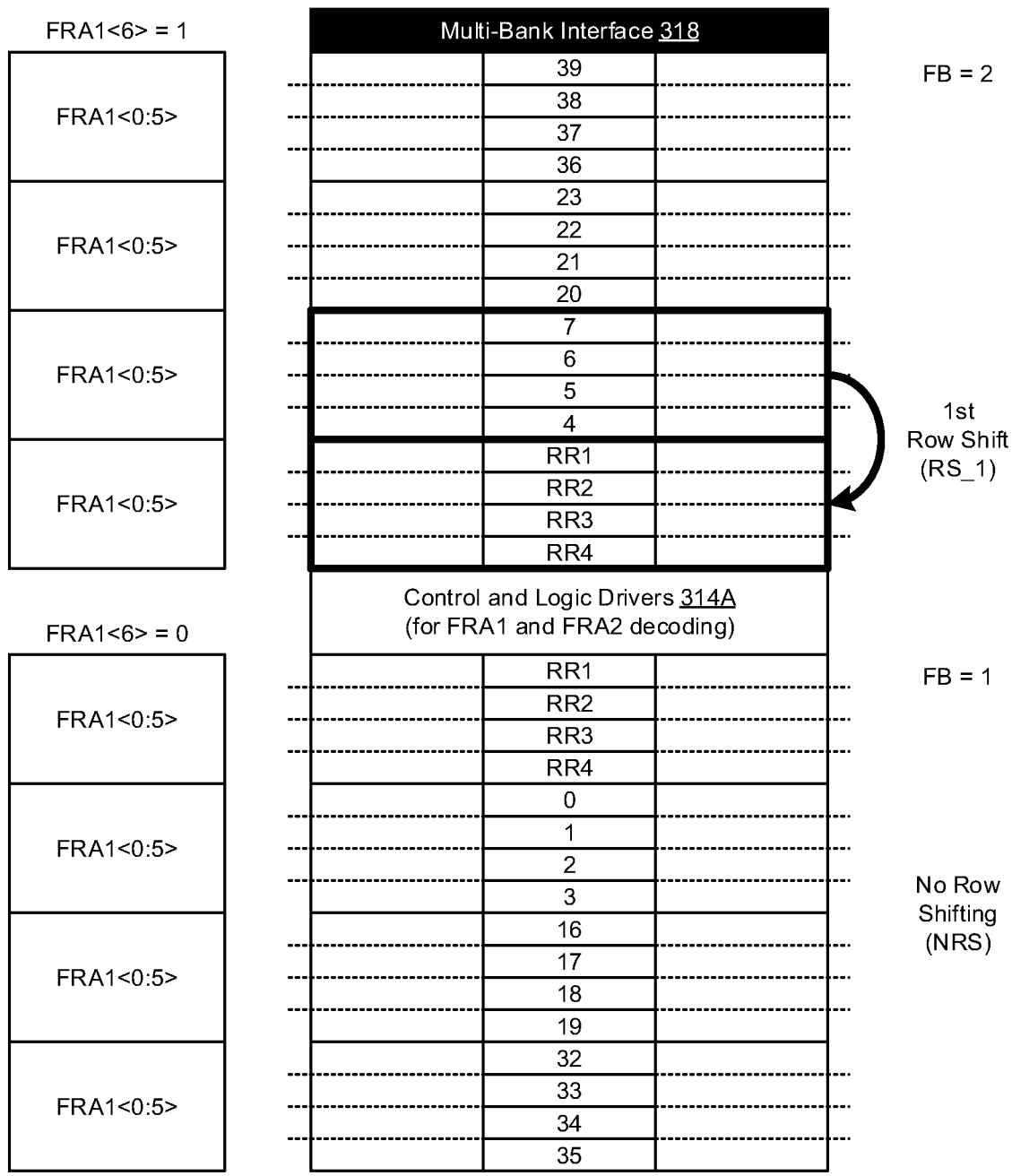
FIGS. 3A-3B illustrate various diagrams of flexible multi-bank architecture in accordance with various implementations described herein.
Figure 3B:
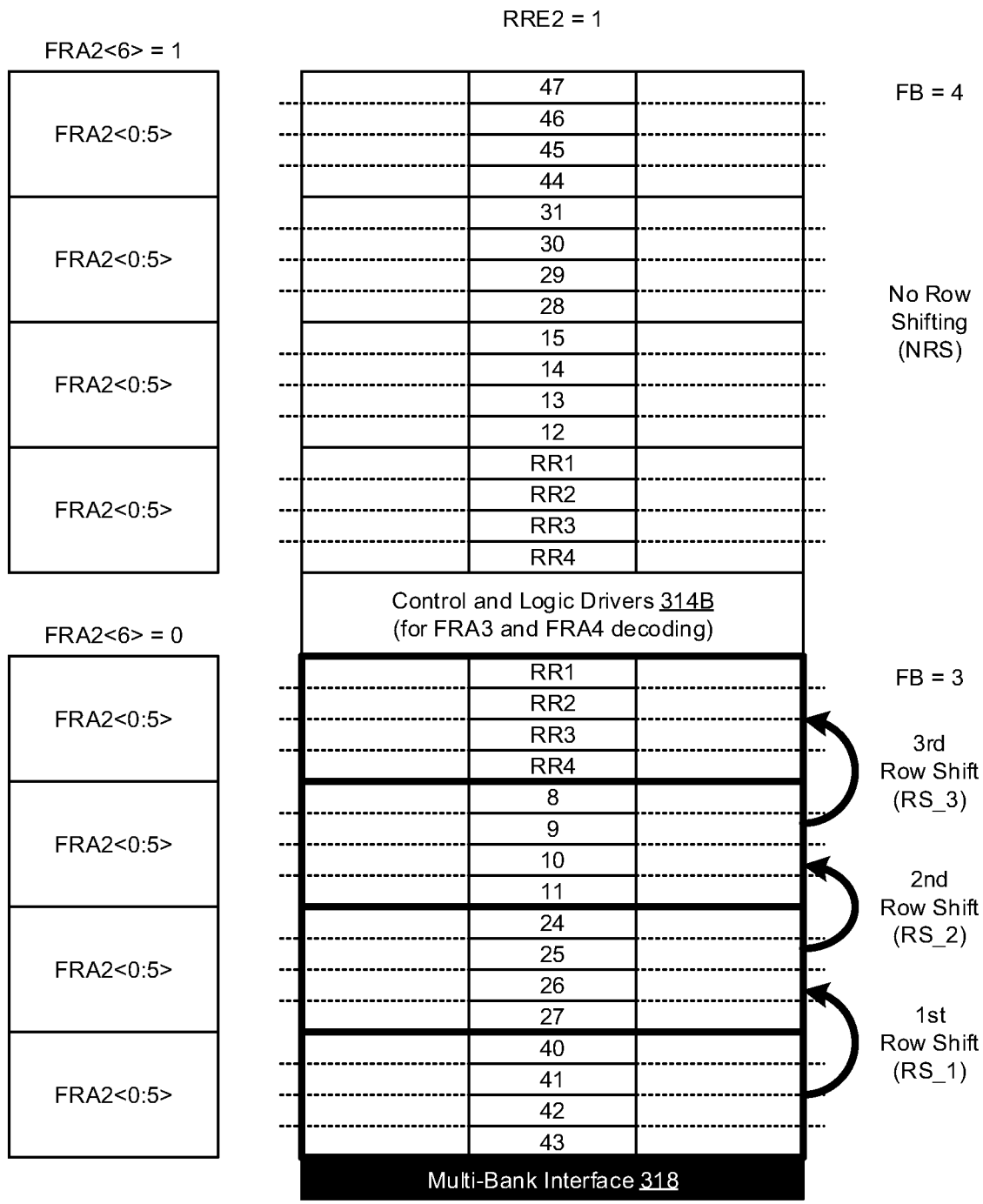

FIGS. 3A-3B illustrate various diagrams of flexible multi-bank architecture 304 in accordance with various implementations described herein. In particular, in reference to flexible multi-bank architecture 304, FIG. 3A shows a diagram 300A of a lower multi-bank architecture 304A having a first bank (FB=1) and a second bank (FB=2), and FIG. 3B shows a diagram 300B of an upper multi-bank architecture 304B having a third bank (FB=3) and a fourth bank (FB=4). As described herein, the lower and upper multi-bank architectures 304A, 304B are coupled together via a multi-bank interface 318.

In some implementations, the multi-bank memory architecture 304, 304A, 304B may be implemented as a system or device having integrated circuit (IC) components that are arranged and coupled together as an assemblage or combination of parts that provide for physical circuit designs and various related structures. In various instances, a method of designing, building, fabricating and manufacturing the multi-bank memory architecture 304, 304A, 304B as an integrated system or device may involve use of various IC circuitry and components described herein so as to implement various row redundancy schemes and techniques associated therewith. Further, the multi-bank memory architecture 304, 304A, 304B may be integrated with computing circuitry and related components on a single chip, and also, the multi-bank memory architecture 204B may be implemented in embedded systems for automotive, electronic, mobile, server and IoT applications.

As shown in FIG. 3A, the lower multi-bank memory architecture 304A may include control and logic driver circuitry 314A that is coupled between the first bank (FB=1) and the second bank (FB=2) for FRA1 and FRA2 decoding. In various implementations, the first bank (FB=1) may have multiple sets of rows (0-3, 16-19, 32-35) along with a set of redundant rows (RR1-RR4), and also, the second bank (FB=2) may have multiple sets of rows (4-7, 20-23, 36-39) along with another set of redundant rows (RR1-RR4).

In various implementations, row redundancy operations may be enabled for the first bank (FB=1) with FRA1<6>=0 or the second bank (FB=2) when FRA1<6>=1. For instance, with RRE=1, FRA1[0:6] and FRA2[0:6], then the second bank (FB=2) is selected for row redundancy operations. In this instance, in reference to a first row shift (RS_1), a first set of rows (4-7) may be shifted to a second set of rows (redundant rows: RR1-RR4). As such, the memory row locations in the second bank (FB=2) are re-mapped such that the rows 4-7 are re-mapped to rows RR1-RR4. Also, the remaining unshifted rows (20-23, 36-39) in the second bank (FB=2) remain accessible with unmodified memory access operations. Moreover, the rows (0-3, 16-19, 32-36) along with the redundant rows (RR1-RR4) in the first bank (FB=1) remain unshifted and also remain accessible with unmodified memory access operations. Therefore, no row redundancy is performed on the first bank (FB=1), and as such, the first bank (FB=1) has no row shifting (NRS).

As shown in FIG. 3B, the upper multi-bank memory architecture 304B may have control and logic driver circuitry 314B that is coupled between the third bank (FB=3) and the fourth bank (FB=4) for FRA3 and FRA4 decoding. In some implementations, the third bank (FB=3) may include multiple sets of rows (8-11, 24-27, 40-43) along with a set of redundant rows (RR1-RR4), and the fourth bank (FB=2) may have multiple sets of rows (12-15-28-31, 44-47) along with another set of redundant rows (RR1-RR4).

In various implementations, row redundancy operations may be enabled for the third bank (FB=3) with FRA2<6>=0 or the fourth bank (FB=4) when FRA2<6>=1. In some instances, with RRE=2, FRA1[0:6] and FRA2[0:6], then the third bank (FB=3) is selected for row redundancy operations. In this instance, in reference to a first row shift (RS_1), a first set of rows (40-43) may be shifted to a second set of rows (24-27). Also, in reference to a second row shift (RS_2), the first set of rows (24-27) may be shifted to a third set of rows (8-11). Also, in reference to a third row shift (RS_3), the third set of rows (40-438-11) may be shifted to a fourth set of rows (redundant rows: RR1-RR4).

Thus, the memory row locations in the third bank (FB=3) are re-mapped such that the rows 40-43 are re-mapped to rows 24-27, rows 24-27 are re-mapped to rows 8-14, and rows 8-11 are re-mapped to rows RR1-RR4. Also, the rows (12-15, 28-31, 44-47) along with the redundant rows (RR1-RR4) in the fourth bank (FB=4) remain unshifted and also remain accessible with unmodified memory access operations. Thus, as shown, no row redundancy is performed on the fourth bank (FB=4), and as such, the fourth bank (FB=4) has no row shifting (NRS).

Figure 4A:
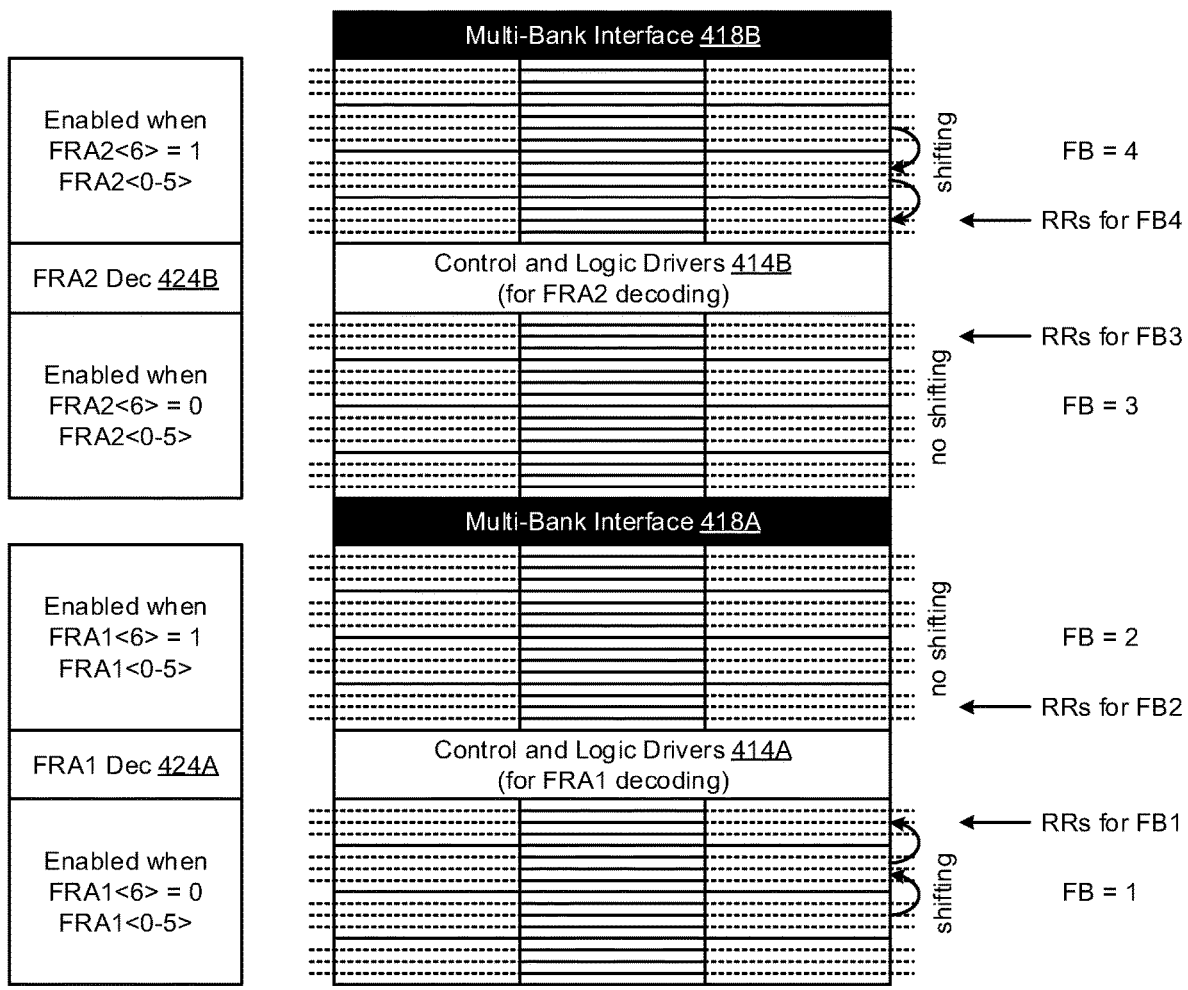
FIGS. 4A-4B illustrate various diagrams of flexible multi-bank architecture in accordance with various implementations described herein.
Figure 4B:
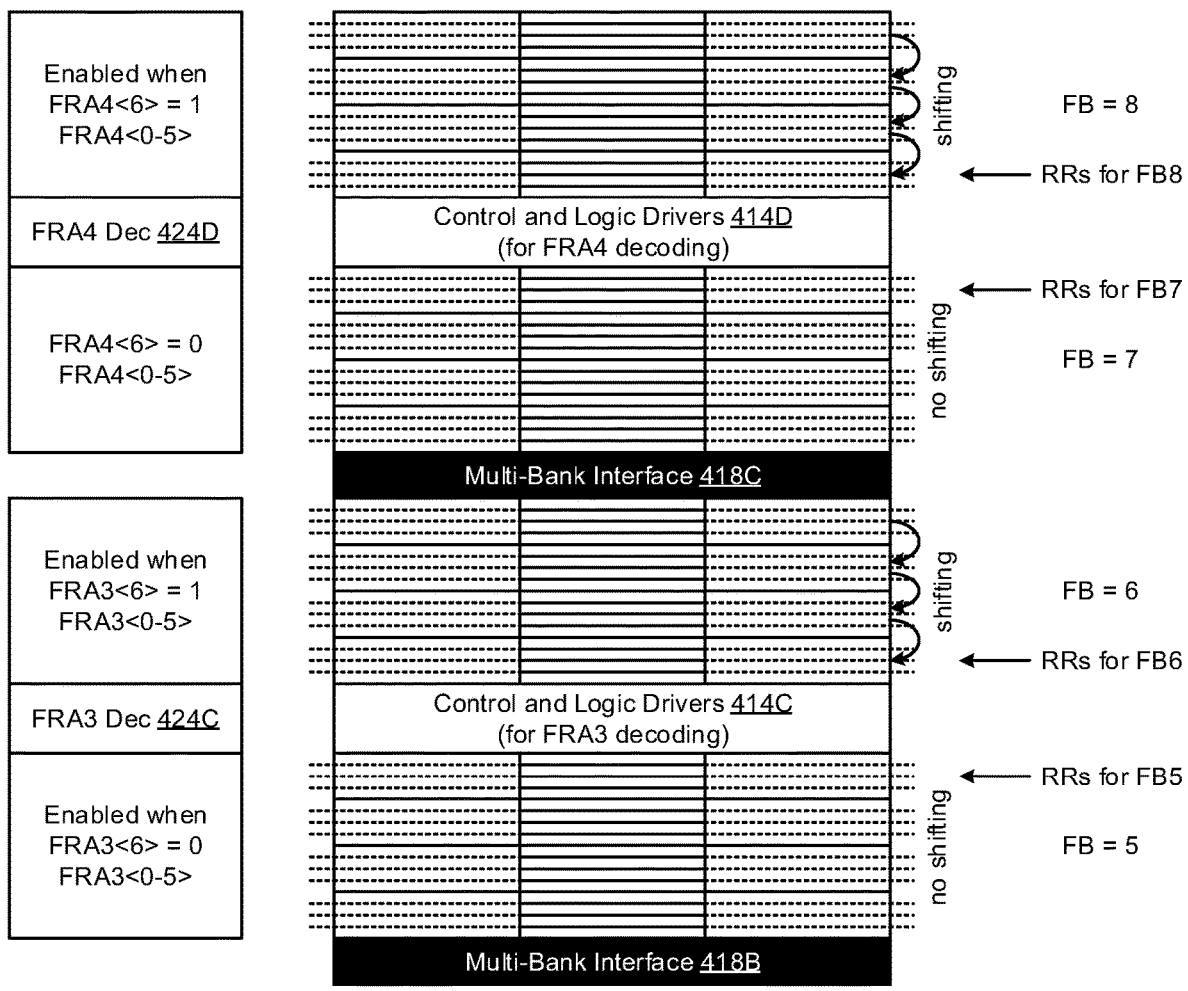

FIGS. 4A-4B illustrate various diagrams of flexible multi-bank architecture 404 in accordance with various implementations described herein. In particular, in reference to flexible multi-bank architecture 404, FIG. 4A shows a diagram 400A of a lower multi-bank architecture 404A with multiple banks (e.g., four banks) including a first bank (FB=1), a second bank (FB=2), a third bank (FB=3) and a fourth bank (FB=4). Further, FIG. 4B shows a diagram 400B of a lower multi-bank architecture 404B with multiple banks (e.g., four banks) including a fifth bank (FB=5), a sixth bank (FB=6), a seventh bank (FB=7) and an eighth bank (FB=8). As described herein, the lower and upper multi-bank architectures 404A, 404B are coupled together via multi-bank interfaces 418A, 418B, 418C.

In some implementations, the multi-bank memory architecture 404, 404A, 404B may be implemented as a system or device having integrated circuit (IC) components that are arranged and coupled together as an assemblage or combination of parts that provide for physical circuit designs and various related structures. In various instances, a method of designing, building, fabricating and manufacturing the multi-bank memory architecture 404, 404A, 404B as an integrated system or device may involve use of various IC circuitry and components described herein so as to implement various row redundancy schemes and techniques associated therewith. Further, the multi-bank memory architecture 404, 404A, 404B may be integrated with computing circuitry and related components on a single chip, and in addition, the multi-bank memory architecture 404, 404A, 404B may be implemented in various embedded systems for automotive, electronic, mobile, server and IoT applications, including remote sensor nodes.

As shown in FIG. 4A, the lower multi-bank memory architecture 404A may include control and logic driver circuitry 414A that is coupled between the first bank (FB=1) and the second bank (FB=2) for FRA1 decoding. Also, in some instances, the lower multi-bank memory architecture 404A may also include control and logic driver circuitry 414B that is coupled between the third bank (FB=3) and fourth bank (FB=4) for FRA2 decoding. In various implementations, each bank (FB=1, FB=2, FB=3, FB=4) may include multiple sets of rows along with a set of redundant rows (RRs).

In various implementations, in reference to the first and second banks (FB=1, FB=2), row redundancy operations may be enabled with a FRA1 decoder 424A, wherein the row redundancy operations are enabled for the first bank (FB=1) when FRA1<6>=0 and FRA1<0-5> and the second bank when FRA1<6>=1 and FRA1<0-5>. In reference to the third and fourth banks (FB=3, FB=4), row redundancy operations may be enabled with a FRA2 decoder 424B, wherein the row redundancy operations may be enabled for the third bank (FB=3) when FRA2<6>=0 and FRA2<0-5> and also the fourth bank when FRA2<6>=1 and FRA2<0-5>.

In various implementations, row redundancy operations may be enabled for the first bank (FB=1) and the fourth bank (FB=4) with RRE2=1, RRE1=1, FRA2<0:6> and FRA1<0:6>. For instance, in reference to the first bank (FB=1), one or more sets of rows may be shifted to redundant rows (RRs for FB1), and also, in reference to the fourth bank (FB=4), one or more sets of rows may be shifted to redundant rows (RRs for FB4). Thus, the memory row locations in the first and fourth banks (FB=1, FB=4) may be re-mapped such that the shifted rows are re-mapped to redundant rows (RRs). Also, the remaining unshifted rows in the first and fourth banks (FB=1, FB=4) may remain accessible with unmodified memory access operations. Also, the rows along with redundant rows (RRs) in the second and third banks (FB=2, FB=3) remain unshifted and also remain accessible with unmodified memory access operations. Therefore, no row redundancy is performed on the second and third banks (FB=2, FB=3), and as such, the second and third banks (FB=2, FB=3) have no row shifting (NRS).

As shown in FIG. 4B, the upper multi-bank memory architecture 404B may include control and logic driver circuitry 414C coupled between the fifth bank (FB=5) and the sixth bank (FB=6) for FRA3 decoding. Also, in some instances, the upper multi-bank memory architecture 404B may also include control and logic driver circuitry 414D that is coupled between the seventh bank (FB=7) and eighth bank (FB=8) for FRA4 decoding. In various implementations, each bank (FB=5, FB=6, FB=7, FB=8) may include multiple sets of rows along with a set of redundant rows (RRs).

In various implementations, in reference to the fifth and sixth banks (FB=5, FB=6), row redundancy operations may be enabled with a FRA3 decoder 424C, wherein the row redundancy operations are enabled for the fifth bank (FB=5) when FRA3<6>=0 and FRA3<0-5> and the sixth bank when FRA3<6>=1 and FRA3<0-5>. In reference to the seventh and eighth banks (FB=7, FB=8), row redundancy operations may be enabled with a FRA4 decoder 424D, wherein the row redundancy operations may be enabled for the seventh bank (FB=7) when FRA4<6>=0 and FRA2<0-5> and also the eighth bank when FRA4<6>=1 and FRA2<0-5>.

In various implementations, row redundancy operations may be enabled for the sixth bank (FB=6) and the eighth bank (FB=8) with RRE4=1, RRE3=1, FRA4<0:6> and FRA3<0:6>. For instance, in reference to the sixth bank (FB=6), one or more sets of rows may be shifted to redundant rows (RRs for FB6), and also, in reference to the eighth bank (FB=8), one or more sets of rows may be shifted to redundant rows (RRs for FB8). Thus, the memory row locations in the sixth and eighth banks (FB=6, FB=8) may be re-mapped such that the shifted rows are re-mapped to redundant rows (RRs). Also, the remaining unshifted rows in the sixth and eighth banks (FB=6, FB=8) may remain accessible with unmodified memory access operations. Also, the rows along with redundant rows (RRs) in the fifth and seventh banks (FB=5, FB=7) remain unshifted and also remain accessible with unmodified memory access operations. Therefore, no row redundancy is performed on the fifth and seventh banks (FB=5, FB=7), and as such, the fifth and seventh banks (FB=5, FB=7) have no row shifting (NRS).

Figure 5:
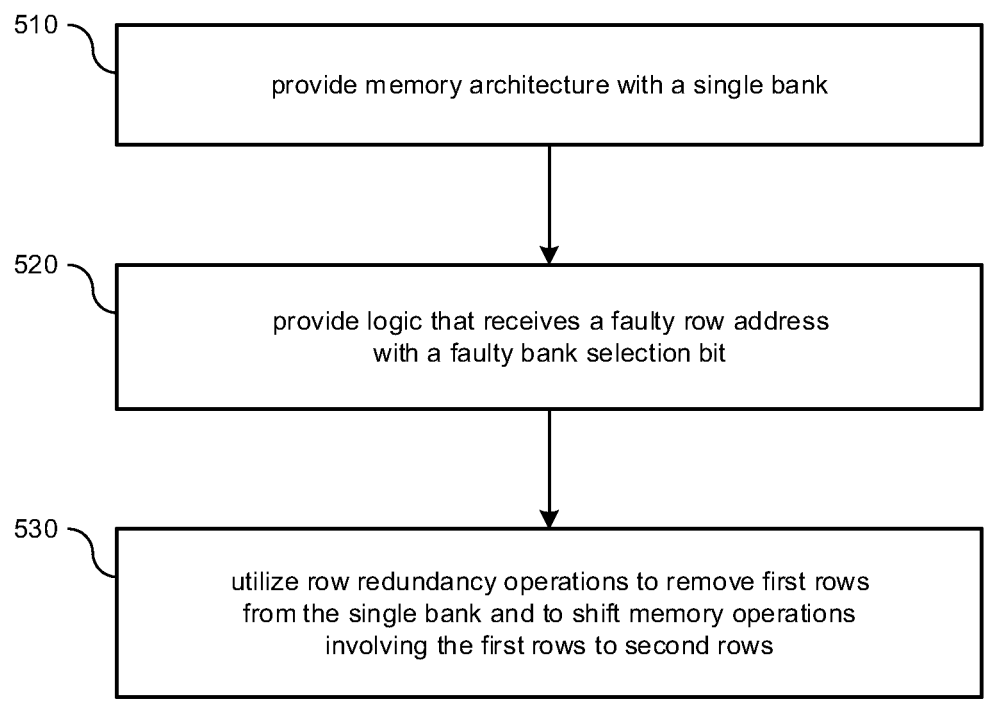
FIG. 5 illustrates a diagram of a method for providing memory architecture with row redundancy in accordance with implementations described herein.

FIG. 5 illustrates a process diagram of a method 500 for providing memory architecture with row redundancy in accordance with various implementations described herein. In various implementations, method 500 may be used to apply row redundancy schemes and techniques to single-bank architecture.

It should be understood that even though the method 500 indicates a particular order of operation execution, in some cases, various particular portions of the operations may be executed in a different order, and on different systems. In other cases, additional operations and/or steps may be added to and/or omitted from method 500. Also, method 500 may be implemented in hardware and/or software. If implemented in hardware, the method 500 may be implemented with various components and/or circuitry, as described herein in reference to FIGS. 1A-4B. Also, if implemented in software, method 500 may be implemented as a program and/or software instruction process configured for providing row redundancy schemes and techniques, as described herein. Moreover, if implemented in software, various instructions associated with implementing method 500 may be stored in memory and/or a database. For instance, various types of computing devices having a processor and memory may be configured to perform method 500.

In various implementations, method 500 may refer to a method of designing, providing, building, fabricating and/or manufacturing an integrated circuit (IC) device that may involve various row redundancy schemes and techniques described herein using various components and materials described herein. The integrated circuit (IC) device may be integrated in various computing circuitry and related components on a single chip, and further, the integrated circuit (IC) device may be implemented in embedded systems for various electronic, mobile and/or Internet-of-things (IoT) applications.

At block 510, method 500 may provide memory architecture with a single bank, and at block 520, method 500 may provide logic that receives a faulty row address with a faulty bank selection bit. Also, at block 530, if the faulty bank selection bit identifies that the faulty row address is in the single bank, then method 500 may utilize row redundancy operations for removing first rows from the single bank and for shifting memory operations involving the first rows to second rows. The logic for the multi-bank memory architecture may be configured with a reduced number of faulty row address pins for row redundancy operations that allow for area savings in physical layout design of the multi-bank memory architecture. Further, in some implementations, method 500 may shift memory operations involving the second rows to third rows associated with redundant rows that are defined in in the single bank, and also, remaining unshifted rows in the single bank may be accessible with unmodified memory access operations.

Figure 6:
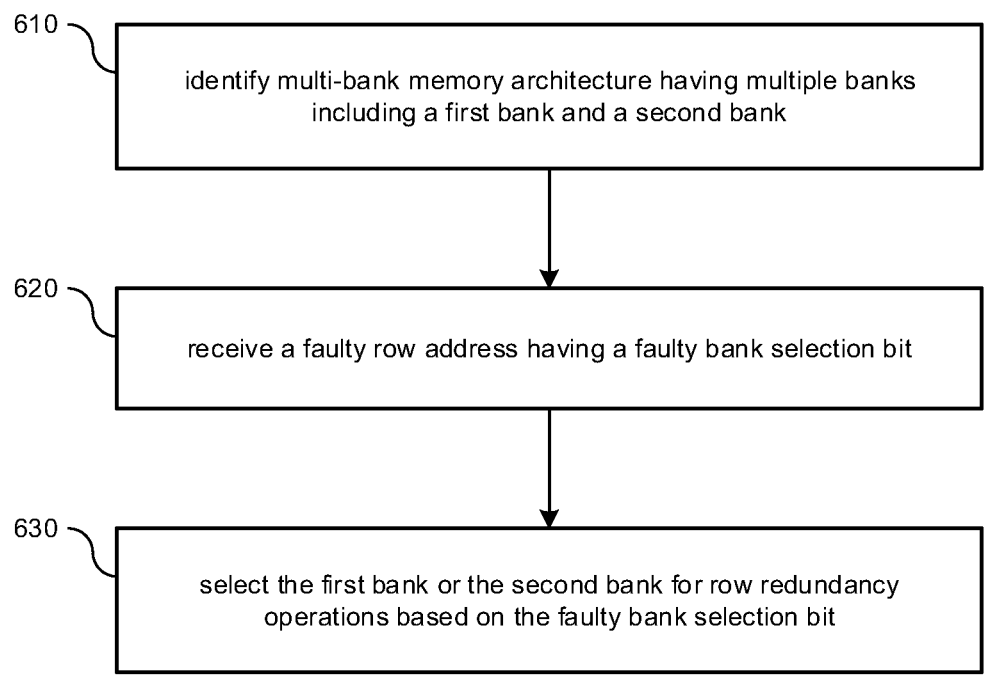
FIG. 6 illustrates a diagram of a method for providing memory architecture with row redundancy in accordance with implementations described herein.

FIG. 6 illustrates a process diagram of a method 600 for providing memory architecture with row redundancy in accordance with various implementations described herein. In various implementations, method 600 may be used to apply row redundancy schemes and techniques to flexible multi-bank architecture.

It should be understood that even though the method 600 indicates a particular order of operation execution, in some cases, various particular portions of the operations may be executed in a different order, and on different systems. In other cases, additional operations and/or steps may be added to and/or omitted from method 600. Also, method 600 may be implemented in hardware and/or software. If implemented in hardware, the method 600 may be implemented with various components and/or circuitry, as described herein in reference to FIGS. 1A-5. Also, if implemented in software, method 600 may be implemented as a program and/or software instruction process configured for providing row redundancy schemes and techniques, as described herein. Also, if implemented in software, various instructions associated with implementing method 600 may be stored in memory and/or a database. For instance, various types of computing devices having a processor and memory may be configured to perform method 600.

In various implementations, method 600 may refer to a method of designing, providing, building, fabricating and/or manufacturing an integrated circuit (IC) device that may involve row redundancy techniques described herein using various components and materials described herein. Also, the integrated circuit (IC) device may be integrated in various computing circuitry and related components on a single chip, and the integrated circuit (IC) device may be implemented in embedded systems for various electronic, mobile and/or Internet-of-things (IoT) applications.

At block 610, method 600 may identify multi-bank memory architecture having multiple banks including a first bank and a second bank. At block 620, method 600 may receive a faulty row address having a faulty bank selection bit. At block 630, method 600 may select the first bank or the second bank for row redundancy operations based on the faulty bank selection bit. The multi-bank memory architecture may be configured with a reduced number of faulty row address pins for the row redundancy operations that allow for area savings in physical layout design of the multi-bank memory architecture.

In some implementations, if the faulty bank selection bit identifies the faulty row address as pertaining to the first bank, then method 600 may utilize the row redundancy operations for removing a first set of rows from the first bank and for shifting memory operations involving the first set of rows to a second set of rows. Also, in some instances, method 600 may shift memory operations involving the second set of rows to a third set of rows associated with a set of redundant rows defined in the first bank. Further, in some instances, remaining unshifted rows in the first bank may be accessible with unmodified memory access operations, and also, rows in the second bank remain unshifted and are accessible with unmodified memory access operations.

In some implementations, if the faulty bank selection bit identifies the faulty row address as pertaining to the second bank, then method 600 may use the row redundancy operations for removing a first set of rows from the second bank and for shifting memory operations involving the first set of rows to a second set of rows. Also, in some instances, method 600 may shift memory operations involving the second set of rows to a third set of rows associated with a set of redundant rows defined in the second bank. Further, in some instances, remaining unshifted rows in the second bank may be accessible with unmodified memory access operations, and also, rows in the first bank remain unshifted and are accessible with unmodified memory access operations.

Various implementations described herein may provide robust row redundancy architecture so as to provide improved row-repair solutions that allow for some significant advantages with respect to repairability of memory instances along with optimal area. For instance, efficient repairability of memory may be achieved as compared to conventional techniques such that no unwanted shifts are performed, and an optimized number of FRA pins for area saving at the SoC level. Also, no comparator logic outside of the memory is needed, which provides for an area benefit and saving in address setup time. In various instances, multiple banks may share the same FRA bits, and thus, repairability is reduced, and at the same time, the number of FRA pins may be reduced, e.g., by half.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a method. The method may identify multi-bank memory architecture having multiple banks including a first bank and a second bank. Also, the method may receive a faulty row address having a faulty bank selection bit, and the method may select the first bank or the second bank for row redundancy operations based on the faulty bank selection bit.

Described herein are various implementations of a method. The method may provide memory architecture with a single bank, and the method may provide logic that receives a faulty row address with a faulty bank selection bit. If the faulty bank selection bit identifies that the faulty row address is in the single bank, then the method may utilize row redundancy operations for removing first rows from the single bank and also shifting memory operations involving the first rows to second rows.

Described herein are implementations of a device having memory architecture with one or more banks, and the device may have logic circuitry that receives a faulty row address with a faulty bank selection bit. Also, the logic circuitry may be configured to use the faulty bank selection bit so as to thereby identify the faulty row address as pertaining to a selected bank of the one or more banks.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A method comprising:
identifying multi-bank memory architecture having multiple banks including a first bank and a second bank;
receiving a faulty row address having a faulty bank selection bit; and
selecting the first bank or the second bank for row redundancy operations based on the faulty bank selection bit.

2. The method of claim 1, wherein:
the multi-bank memory architecture is configured with a reduced number of faulty row address pins for the row redundancy operations that allow for area savings in physical layout design of the multi-bank memory architecture.

3. The method of claim 1, wherein:
if the faulty bank selection bit identifies the faulty row address as pertaining to the first bank, then the method utilizes the row redundancy operations for:
removing a first set of rows from the first bank; and
shifting memory operations involving the first set of rows to a second set of rows.

4. The method of claim 3, further comprising:
shifting memory operations involving the second set of rows to a third set of rows associated with a set of redundant rows defined in the first bank.

5. The method of claim 3, wherein:
remaining unshifted rows in the first bank are accessible with unmodified memory access operations.

6. The method of claim 5, wherein:
rows in the second bank remain unshifted and are accessible with unmodified memory access operations.

7. The method of claim 1, wherein:
if the faulty bank selection bit identifies the faulty row address as pertaining to the second bank, then the method utilizes the row redundancy operations for:
removing a first set of rows from the second bank; and
shifting memory operations involving the first set of rows to a second set of rows.

8. The method of claim 7, wherein:
shifting memory operations involving the second set of rows to a third set of rows associated with a set of redundant rows defined in the second bank.

9. The method of claim 7, wherein:
remaining unshifted rows in the second bank are accessible with unmodified memory access operations.

10. The method of claim 9, wherein:
rows in the first bank remain unshifted and are accessible with unmodified memory access operations.

11. A method comprising:
providing memory architecture with a single bank;
providing logic that receives a faulty row address with a faulty bank selection bit; and
if the faulty bank selection bit identifies that the faulty row address is in the single bank, then the method utilizes row redundancy operations for:
removing first rows from the single bank; and
shifting memory operations involving the first rows to second rows.

12. The method of claim 11, wherein:
the logic for the multi-bank memory architecture is configured with a reduced number of faulty row address pins for the row redundancy operations that allow for area savings in physical layout design of the multi-bank memory architecture.

13. The method of claim 11, further comprising:
shifting memory operations involving the second rows to third rows associated with redundant rows that are defined in in the single bank.

14. The method of claim 13, wherein:
remaining unshifted rows in the single bank are accessible with unmodified memory access operations.

15. A device comprising:
memory architecture having one or more banks; and
logic circuitry that receives a faulty row address having a faulty bank selection bit,
wherein the logic circuitry is configured to utilize the faulty bank selection bit to identify the faulty row address as pertaining to a selected bank of the one or more banks.

16. The device of claim 15, wherein:
the logic circuitry for the memory architecture is configured with a reduced number of faulty row address pins for row redundancy operations that allow for area savings in physical layout design of the memory architecture.

17. The device of claim 15, wherein:
the logic circuitry is configured to utilize row redundancy operations for:
  removing first rows from the selected bank;
  shifting memory operations involving the first rows to second rows; and
  shifting memory operations involving the second rows to third rows associated with redundant rows that are defined in in the selected bank.

18. The device of claim 15, wherein:
the memory architecture refers to multi-bank memory architecture with multiple banks including a first bank and a second bank,
the one or more banks of the memory architecture refer to the multiple banks having the first bank and the second bank, and
the logic circuitry selects the first bank or the second bank as the selected bank for row redundancy operations based on the faulty bank selection bit.

19. The device of claim 18, wherein:
if the logic circuitry identifies the faulty row address as pertaining to the first bank, then the logic circuitry utilizes the row redundancy operations for:
removing first rows from the first bank;
shifting memory operations involving the first rows to second rows; and
shifting memory operations involving the second rows to third rows associated with redundant rows defined in the first bank.

20. The device of claim 18, wherein:
if the logic circuitry identifies the faulty row address as pertaining to the second bank, then the logic circuitry utilizes the row redundancy operations for:
removing first rows from the second bank;
shifting memory operations involving the first rows to second rows; and
shifting memory operations involving the second rows to third rows associated with redundant rows defined in the second bank.

* * * * *